United States Patent
Komatsu (10) Patent No.: US 11,262,388 B2
(45) Date of Patent: Mar. 1, 2022

(54) CURRENT DETECTION CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Terumitsu Komatsu, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 491 days.

(21) Appl. No.: 16/267,169

(22) Filed: Feb. 4, 2019

(65) Prior Publication Data
US 2020/0064381 A1    Feb. 27, 2020

(30) Foreign Application Priority Data
Aug. 24, 2018    (JP) .............................. JP2018-157626

(51) Int. Cl.
*G01R 19/00*    (2006.01)
*G01R 31/26*    (2020.01)
*H02H 3/08*    (2006.01)
*H02H 9/02*    (2006.01)

(52) U.S. Cl.
CPC ..... *G01R 19/0092* (2013.01); *G01R 31/2607* (2013.01); *H02H 3/08* (2013.01); *H02H 9/02* (2013.01)

(58) Field of Classification Search
CPC .......... G01R 19/0092; H02H 3/08–13; H02H 9/02–028
See application file for complete search history.

(56) References Cited

U.S. PATENT DOCUMENTS

| | | |
|---|---|---|
| 5,079,456 A | 1/1992 | Kotowski et al. |
| 7,245,116 B2 | 7/2007 | Tateno et al. |
| 7,342,391 B2 | 3/2008 | Tateno et al. |
| 7,550,959 B2 | 6/2009 | Tateno et al. |
| 7,804,310 B2 | 9/2010 | Amada |
| 7,952,333 B2 | 5/2011 | Heppenstall |
| 8,659,864 B2 | 2/2014 | Uemura |

(Continued)

FOREIGN PATENT DOCUMENTS

| | | |
|---|---|---|
| JP | S63241469 A | 10/1988 |
| JP | 2003028901 A | 1/2003 |

(Continued)

*Primary Examiner* — Jared Fureman
*Assistant Examiner* — Christopher J Clark
(74) *Attorney, Agent, or Firm* — Holtz, Holtz & Volek PC (57) ABSTRACT

According to an embodiment(s), a current detection circuit has first and second main electrodes, a vertical structure output transistor that includes a first control electrode where a control signal is supplied thereto, a third main electrode that is connected to the first main electrode, a second control electrode that is connected to the first control electrode, and a vertical structure detection transistor that has a fourth main electrode. The current detection circuit has a voltage supply circuit that supplies a divided voltage of a voltage between the first and second main electrodes to the fourth main electrode.

17 Claims, 6 Drawing Sheets

(56) References Cited

U.S. PATENT DOCUMENTS

| | | | |
|---|---|---|---|
| 9,425,788 B1* | 8/2016 | Jin | H01L 29/402 |
| 2005/0231177 A1 | 10/2005 | Tateno et al. | |
| 2007/0236204 A1 | 10/2007 | Tateno et al. | |
| 2008/0129273 A1 | 6/2008 | Tateno et al. | |
| 2008/0191779 A1* | 8/2008 | Heppenstall | H03K 17/0822 |
| | | | 327/427 |
| 2009/0267587 A1 | 10/2009 | Tateno et al. | |
| 2012/0187930 A1* | 7/2012 | Williams | G05F 1/5735 |
| | | | 323/273 |
| 2013/0049137 A1* | 2/2013 | Uno | H01L 23/49562 |
| | | | 257/401 |

FOREIGN PATENT DOCUMENTS

| | | | |
|---|---|---|---|
| JP | 2005304210 A | 10/2005 | |
| JP | 2008543208 A | 11/2008 | |
| JP | 4773411 B2 | 9/2011 | |
| JP | 5666694 B2 | 2/2015 | |
| JP | 5724281 B2 | 5/2015 | |

* cited by examiner

CURRENT DETECTION CIRCUIT

CROSS-REFERENCE TO RELATED APPLICATIONS

This application is based upon and claims the benefit of priority from Japanese Patent Application No. 2018-157626, filed on Aug. 24, 2018; the entire contents of which are incorporated herein by reference

FIELD

The present embodiment generally relates to a current detection circuit.

BACKGROUND

A current detection circuit has conventionally been disclosed that senses an output current of an output transistor by using an N-channel-type MOS transistor. However, in a case where an N-channel-type output transistor is used on a high side, a charge pump to supply a switching signal that controls on/off of an output transistor is needed. A charge pump generates a high-voltage switching signal, so that a high electromagnetic interference (EMI) measure is demanded. Furthermore, an attempt to use a multi-source P-channel-type MOS transistor that has a vertical structure on a high side is executed. In such a case, a source of an output transistor is directly connected to a power source terminal, so that a voltage drop that is caused between the source of an output transistor and the power source terminal is minute. Hence, in a case where an amplifier that responds to an output current is provided on a source side of a detection transistor that detects the output current, its offset voltage greatly influences a current sense ratio for detecting an output current and causes reducing of accuracy of the current sense ratio.

DETAILED DESCRIPTION

According to the present embodiment, a current detection circuit has a vertical structure output transistor that includes a first main electrode, a second main electrode, and a first control electrode where on/off thereof is controlled by a control signal that is applied to the first control electrode. The current detection circuit has a vertical structure detection transistor that has a third main electrode that is connected to the first main electrode, a second control electrode that is connected to the first control electrode, and a fourth main electrode. The current detection circuit has a voltage-dividing circuit that is connected between the first main electrode and the second main electrode and outputs a divided voltage provided by dividing a voltage between the first main electrode and the second main electrode at a predetermined ratio. It has a voltage supply circuit that supplies the divided voltage to the fourth main electrode.

Hereinafter, a current detection circuit according to an embodiment will be explained in detail with reference to the accompanying drawings. Additionally, the present invention is not limited by such an embodiment.

First Embodiment

Figure 1:
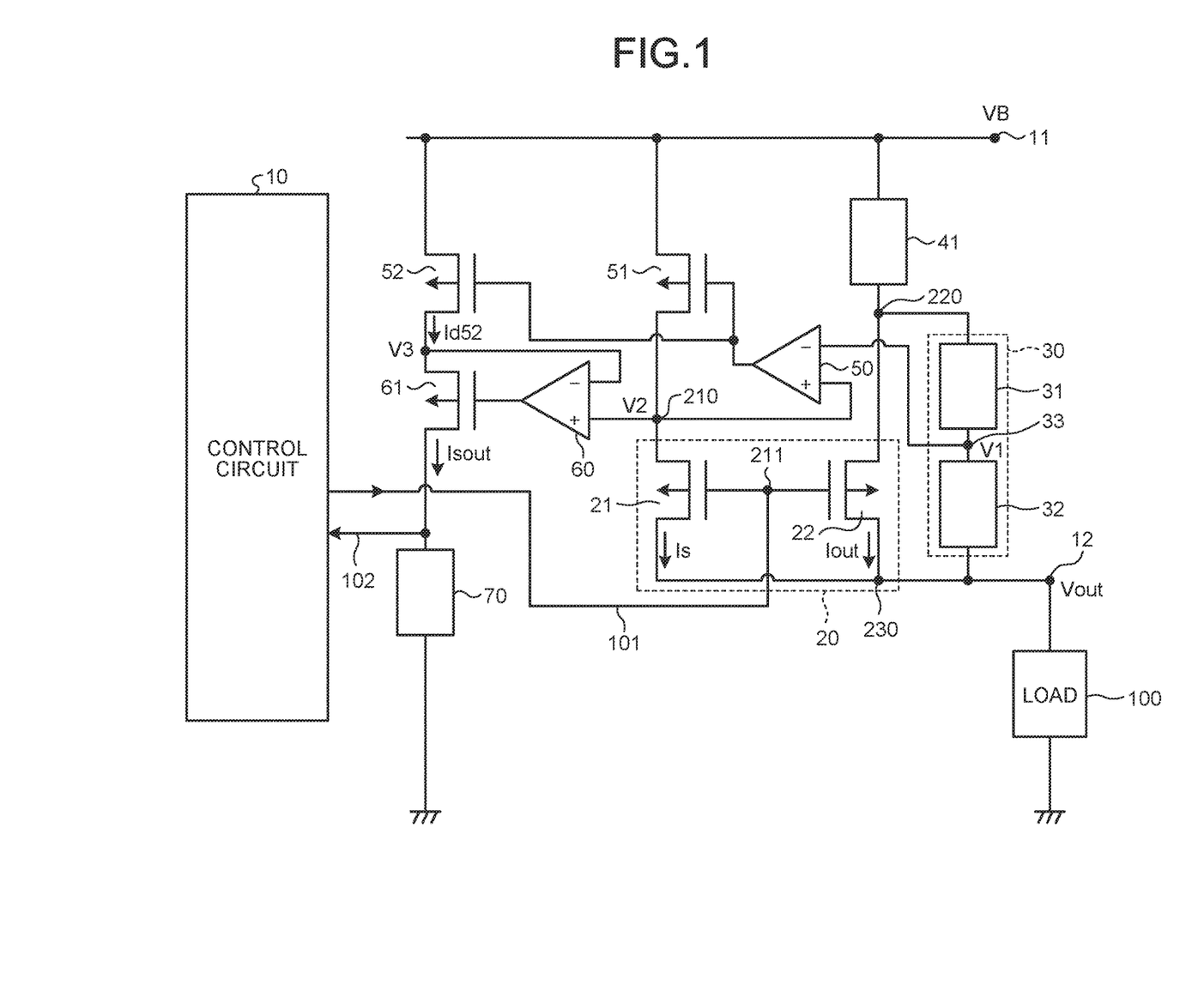
FIG. 1 is a diagram that illustrates a current detection circuit according to a first embodiment.

FIG. 1 is a diagram that illustrates a current detection circuit according to a first embodiment. A current detection circuit according to the present embodiment has a switching element 20. The switching element 20 has a vertical structure P-channel-type output transistor 22 and a detection transistor 21 and composes a multi-source vertical structure MOS transistor (that may simply be referred to as a transistor). The output transistor 22 and the detection transistor 21 are connected to an output terminal 12 via a common drain 230. A load 100 is connected to the output terminal 12.

Additionally, a vertical structure as mentioned herein means a structure where a source and a drain that are main electrodes are formed on a front surface side and a back surface side of a (non-illustrated) semiconductor substrate, respectively, and a current flows in a vertical direction between the source and the drain. By providing a vertical structure, a distance between a source and a drain is increased, so that it is possible to provide a high withstand voltage structure.

A source 220 of the output transistor 22 is connected to a power source terminal 11 via a resistor 41. The resistor 41 equivalently indicates a parasitic resistance such as a (non-illustrated) wire that connects the source 220 to the power source terminal 11.

A source 210 of the detection transistor 21 is connected to a drain of a transistor 51 and a source of the transistor 51 is connected to the power source terminal 11.

A current detection circuit according to the present embodiment has a voltage-dividing circuit 30. The voltage-dividing circuit 30 has serially connected resistors 31 and 32 in parallel to the output transistor 22. A connection point 33 of the resistors 31 and 32 is an output terminal of the voltage-dividing circuit 30 and outputs an output voltage V1 dependent on a voltage-dividing ratio. Values of the resistors 31 and 32 are set at sufficiently high values relative to an on-resistance of the output transistor 22. Thereby, it is possible to ignore a current that flows into the voltage-dividing circuit 30 from the resistor 41.

A voltage V1 at the connection point 33 of the voltage-dividing circuit 30 is expressed by the following formula (1), where VB is a voltage that is applied to the power source terminal 11, Rp is a value of the resistor 41, Iout is a drain current that flows through the output transistor 22, Rm is an on-resistance of the output transistor 22, and D is a voltage-dividing ratio of the voltage-dividing circuit 30.

$$V1 = VB - \{Rp \times Iout + Rm \times Iout/D \times (D-1)\} \quad (1)$$
$$= VB - \{Rp + Rm/D \times (D-1)\} \times Iout$$

Additionally, it is possible to set a voltage-dividing ratio D depending on a ratio of resistance values of the resistor 31 and the resistor 32. Furthermore, it is possible to express a voltage VB at the power source terminal 11 by the following formula (2).

$$VB = Vout + Iout \times (Rp + Rm) \quad (2)$$

The connection point 33 is connected to an inverting input terminal of an amplifier 50. That is, the voltage V1 at the connection point 33 is supplied to an inverting input terminal of the amplifier 50. The source 210 of the detection transistor 21 is connected to a non-inverting input terminal of the amplifier 50. An output of the amplifier 50 is supplied to a gate of the transistor 51.

The amplifier 50 and the transistor 51 compose a voltage supply circuit. An imaginary short is provided between input terminals of the amplifier 50 and the amplifier 50 and the transistor 51 operates in such a manner that a source voltage V2 of the detection transistor 21 and the voltage V1 at the connection point 33 are equal.

A source-drain voltage of the output transistor 22 is divided by the voltage-dividing circuit 30 to be supplied to a source of the detection transistor 21. In a case where source-drain voltages of the output transistor 22 and the detection transistor 21 are equal, the output transistor 22 and the detection transistor 21 output drain currents at a ratio of on-resistances thereof. On the contrary, in a case where a source-drain voltage of the detection transistor 21 is different from that of the output transistor 22, the output transistor 22 and the detection transistor 21 output drain currents depending on a ratio of different source-drain voltages and a ratio of on-resistances thereof. Therefore, it is possible to set a current ratio by a ratio of on-resistances and voltages to be applied between sources and drains of the output transistor 22 and the detection transistor 21, and as a result, it is possible to set a current sense ratio.

A divided voltage V1 is applied to a source of the detection transistor 21, so that it is possible to set a ratio of a drain current of the detection current 21 to that of the output transistor 22, that is, a current sense ratio, by a voltage-dividing ratio D of the voltage-dividing circuit 30. For example, in a case where a ratio of on-resistances of the output transistor 22 and the detection transistor 21 is 1:10000, as a voltage-dividing ratio D is 2 (that is, ½ of a source voltage of the output transistor 22 is applied to a source of the detection transistor 21), it is possible to set a ratio of a drain current of the output transistor 22 to that of the detection transistor 21 at 20000:1.

A source voltage V2 of the detection transistor 21 is expressed by the following formula (3), where Vof1 is an offset voltage of the amplifier 50.

$$V2 = V1 + Vof1 \quad (3)$$

Furthermore, it is possible to express a drain current Is of the detection transistor 21 by the following formula (4).

$$Is = (V2 - Vout)/Rs \quad (4)$$

Rs represents an on-resistance of the detection transistor 21.

The following formula (5) is obtained from formula (1) to formula (4).

$$Is = (Rm/D \times Iout - Vof1)/Rs \quad (5)$$

It is found from formula (5) that Iout/Is is a value that is proportional to Rs×D/Rm. That is, it is possible to set a current ratio of the output transistor 22 and the detection transistor 21 by a voltage-dividing ratio D.

A differential voltage between a voltage VB and an output voltage Vout is applied to both terminals of each of a series circuit of the output transistor 22 and the resistor 41 and a series circuit of the detection transistor 21 and the transistor 51, so that a relationship of the following formula (6) is satisfied.

$$(R1 + Rs) \times Is = (Rp + Rm) \times Iout \quad (6)$$

R1 represents a resistance value of the transistor 51. It is possible to express a resistance R1 by the following formula (7) from formula (6).

$$R1 = (Rp + Rm) \times Iout/Is - Rs \quad (7)$$

An output of the amplifier 50 is also supplied to a gate of a transistor 52, gate-source voltages of the transistors 51 and 52 are equal. A source of the transistor 52 is connected to the power source terminal 11 and a drain thereof is connected to a source of a transistor 61. An output of an amplifier 60 is supplied to a gate of the transistor 61.

The source 210 of the detection transistor 21 is connected to a non-inverting input terminal of the amplifier 60 and an inverting input terminal of the amplifier 60 is connected to a source of the transistor 61. The amplifier 60 and the transistor 61 compose a voltage supply circuit. An imaginary short is provided between input terminals of the amplifier 60 and the amplifier 60 and the transistor 61 supplies a voltage V2 to a drain of the transistor 52.

An output of the amplifier 50 is supplied to gates of the transistors 51 and 52 and their respective sources are connected to the power source terminal 11. Therefore, in a case where a voltage V2 and a drain voltage V3 of the transistor 52 are equal, source-drain voltages of the transistors 51 and 52 are also equal, so that drain currents dependent on a ratio of respective on-resistances flow through the transistors 51 and 52. That is, in a case where values of on-resistances of transistors 51 and 52 are of 1:N, drain currents at N:1 flow through the transistors 51 and 52. In the present embodiment, the transistors 51 and 52 are set at a dimension ratio to have identical on-resistances in such a manner that drain currents with an identical value flow therethrough.

It is possible to express a drain current Id52 of the transistor 52 by the following formula (8).

$$Id52 = (VB - V3)/R2 \quad (8)$$

R2 represents an on-resistance of the transistor 52. A drain current I52 as a detection current Isout is supplied to a detection resistor 70 via the transistor 61.

If the drain current Id52 and a detection current Isout that flows through the transistor 61 are equal, it is possible to express the detection current Isout by the following formula (9).

$$Id52 = Isout = (VB - V3)/R2 \quad (9)$$

A detection current Isout is expressed by the following formula (10) where Vof2 is an offset voltage of the amplifier 60.

$$Isout = \{VB - (V2 + Vof2)\}/R2 \quad (10)$$

It is possible to express the following formula (11) from formula (1), formula (3), and formula (10).

$$\begin{aligned} Isout &= \{VB - (V1 + Vof1 + Vof2)\}/R2 \quad (11) \\ &= \{VB - (VB - \{Rp + Rm/D \times (D-1)\} \times Iout) + \\ &\quad Vof1 + Vof2\}/R2 \\ &= (Rp + Rm/D \times (D-1)) \times Iout - Vof1 - Vof2)/R2 \end{aligned}$$

It is possible to include a term of $\{Rm/D \times (D-1)\} \times Iout$ in a detection current Isout, so that it is possible to suppress influences of offsets of the amplifiers 50, 60 and it is possible to improve accuracy of a current sense ratio (Iout/Isout).

Moreover, if values of resistances of R1 and R2 are equal, the following formula (12) is obtained.

$$Isout=((Rp+Rm/D \times (D-1)) \times Iout - Vof1 - Vof2)/\{(Rp+Rm) \times Iout/Is-Rs\} \qquad (12)$$

It is possible to adjust a detection output current Isout by a voltage-dividing ratio D. That is, it is possible to readily adjust a current sense ratio (Iout/Isout) by a voltage-dividing ratio D.

Information of a voltage drop that is caused at the detection resistor 70 is supplied to a control circuit 10 via a signal line 102. The control circuit 10 supplies a driving signal that controls on/off of the output transistor 22 and the detection transistor 21 to a gate 211 of the output transistor 22 and the detection transistor 21 via a signal line 101.

If Rp=1 mΩ, Rm=9 mΩ, Rs=90Ω, Iout=1 A, Vof1=−1 mV, Vof2=−1 mV, and D=2 are provided, Is=0.039 mA is obtained from formula (4). Furthermore, Isout=0.045 mA is obtained from formula (12). Therefore, a current sense ratio is Iout/Isout=22222. Therefore, it is possible to suppress an error at 11% for a current sense ratio of 20000 where a voltage-dividing ratio D is set at 2.

According to the present embodiment, the output transistor 22 and the detection transistor 21 on a high side are composed of a PMOS transistor, so that a charge pump to supply a high-voltage switching signal that controls on/off thereof does not have to be provided. Therefore, it is possible to use a current detection circuit according to the present embodiment even in a case where a high electromagnetic interference (EMI) measure is demanded.

Furthermore, it is possible to readily set a current sense ratio (Iout/Isout) by a setting of a voltage-dividing ratio D. Thereby, it is possible to increase a degree of freedom of circuit design. Moreover, it is possible to suppress influences of offset voltages of the amplifiers 50, 60, so that it is possible to improve accuracy of a current sense ratio.

Figure 2:
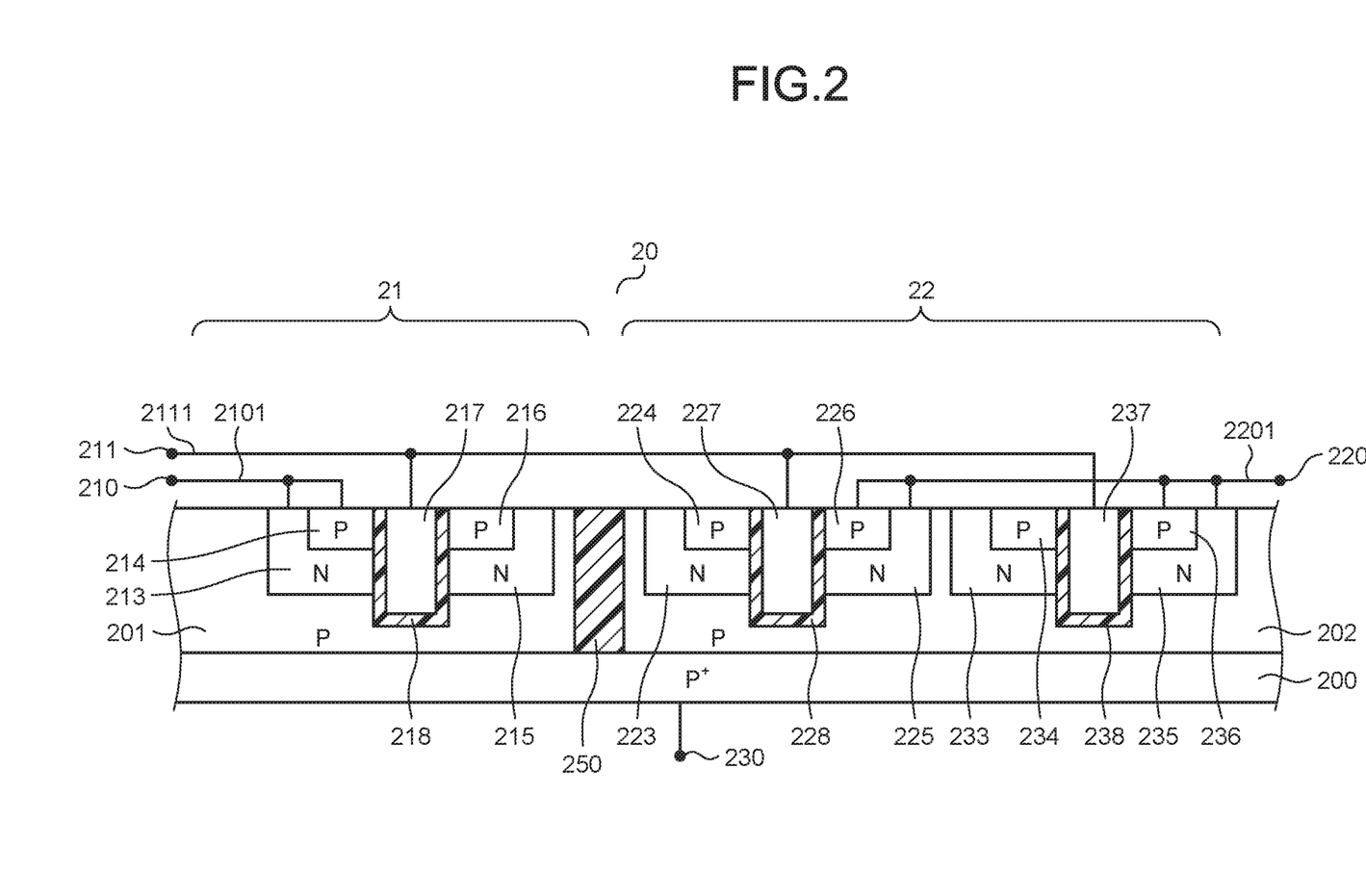
FIG. 2 is a diagram that illustrates an example of a vertical structure MOS transistor.

FIG. 2 is a diagram that illustrates an example of a vertical structure MOS transistor that is used as the switching element 20. An identical sign is provided to a component that corresponds to that of an embodiment as already described and a redundant description is provided only in a case of need. A similar matter applies hereinafter. FIG. 2 schematically illustrates a cross-sectional structure of the switching element 20 that includes the detection transistor 21 and the output transistor 22.

The switching element 20 has a P-type semiconductor substrate 200. It has P-type epitaxial layers 201, 202 on the semiconductor substrate 200. N-type diffusion regions 213, 215 are formed on the epitaxial layer 201. P-type diffusion regions 214, 216 are formed on the diffusion regions 213, 215.

It has a region 217 that is formed to penetrate through the diffusion regions 213 to 216. The region 217 and each of the diffusion regions 213 to 216 are separated by an oxidized film 218. The region 217 is composed of, for example, a polycrystalline silicon layer doped with an impurity. Additionally, the N-type diffusion regions 213, 215 and the P-type diffusion regions 214, 216 are formed as an integrated region that continuously surrounds the region 217.

A P-channel-type detection transistor 21 is composed of the diffusion regions 214, 216 that are provided as source regions, the epitaxial layer 201 and the semiconductor substrate 200 that are provided as drain regions, and the region 217 that is provided as a gate.

The diffusion region 213 is connected to the source 210 via a wire 2102. The diffusion region 214 is connected to the source 210 via wires 2101, 2103. The region 217 is connected to the gate 211 via a wire 2112.

N-type diffusion regions 223, 225 are formed on the epitaxial layer 202 that is separated by a separation region 250. P-type diffusion regions 224, 226 are formed on the diffusion regions 223, 225.

It has a region 227 that penetrates through the diffusion regions 223 to 226. The region 227 and each of the diffusion regions 223 to 226 are separated by an oxidized film 228. The region 227 is composed of, for example, a polycrystalline silicon layer doped with an impurity. Additionally, the N-type diffusion regions 223, 225 and the P-type diffusion regions 224, 226 are formed as an integrated region that continuously surrounds the region 227.

A P-channel-type transistor is composed of the diffusion regions 224, 226 that are provided as source regions, the epitaxial layer 202 and the semiconductor substrate 200 that are provided as drain regions, and the region 227 that is provided as a gate.

The diffusion region 225 is connected to the source 220 via a wire 2201. The diffusion region 226 is connected to the source 220 via the wire 2201. The region 227 is connected to the gate 211 via a wire 2111.

N-type diffusion regions 233, 235 are further formed on the epitaxial layer 202. P-type diffusion regions 234, 236 are formed on the diffusion regions 233, 235.

It has a region 237 that penetrates through the diffusion regions 233 to 236. The region 237 and each of the diffusion regions 233 to 236 are separated by an oxidized film 238. The region 237 is composed of, for example, a polycrystalline silicon layer doped with an impurity. Additionally, the N-type diffusion regions 233, 235 and the P-type diffusion regions 234, 236 are formed as an integrated region that continuously surrounds the region 237.

A P-channel-type transistor is composed of the diffusion regions 234, 236 that are provided as source regions, the epitaxial layer 202 and the semiconductor substrate 200 that are provided as drain regions, and the region 237 that is provided as a gate. The output transistor 22 is composed of two transistors that are formed on the epitaxial layer 202.

The diffusion region 235 is connected to the source 220 via the wire 2201. The diffusion region 236 is connected to the source 220 via the wire 2201. The region 237 is connected to the gate 211 via the wire 2111.

Conveniently, FIG. 2 illustrates a configuration where one MOS transistor is formed on the epitaxial layer 201 and two MOS transistors that are connected in parallel are formed on the epitaxial layer 202. The number of MOS transistors that are connected in parallel is adjusted, so that it is possible to adjust values of on-resistances thereof. Thereby, a ratio of drain currents that flow through the output transistor 22 and the detection transistor 21 is adjusted, so that it is possible to adjust a current sense ratio.

In a configuration of FIG. 2, in a case where a channel between a source and a drain of each transistor is formed by a voltage that is applied to the gate 211, a drain current in a vertical direction flows from a top surface side (a source side) to a bottom side (a drain side). Furthermore, two sources are provided on a surface side of a semiconductor substrate. Hence, it may be referred to as a multi-source MOS transistor that has a vertical structure.

Second Embodiment

Figure 3:
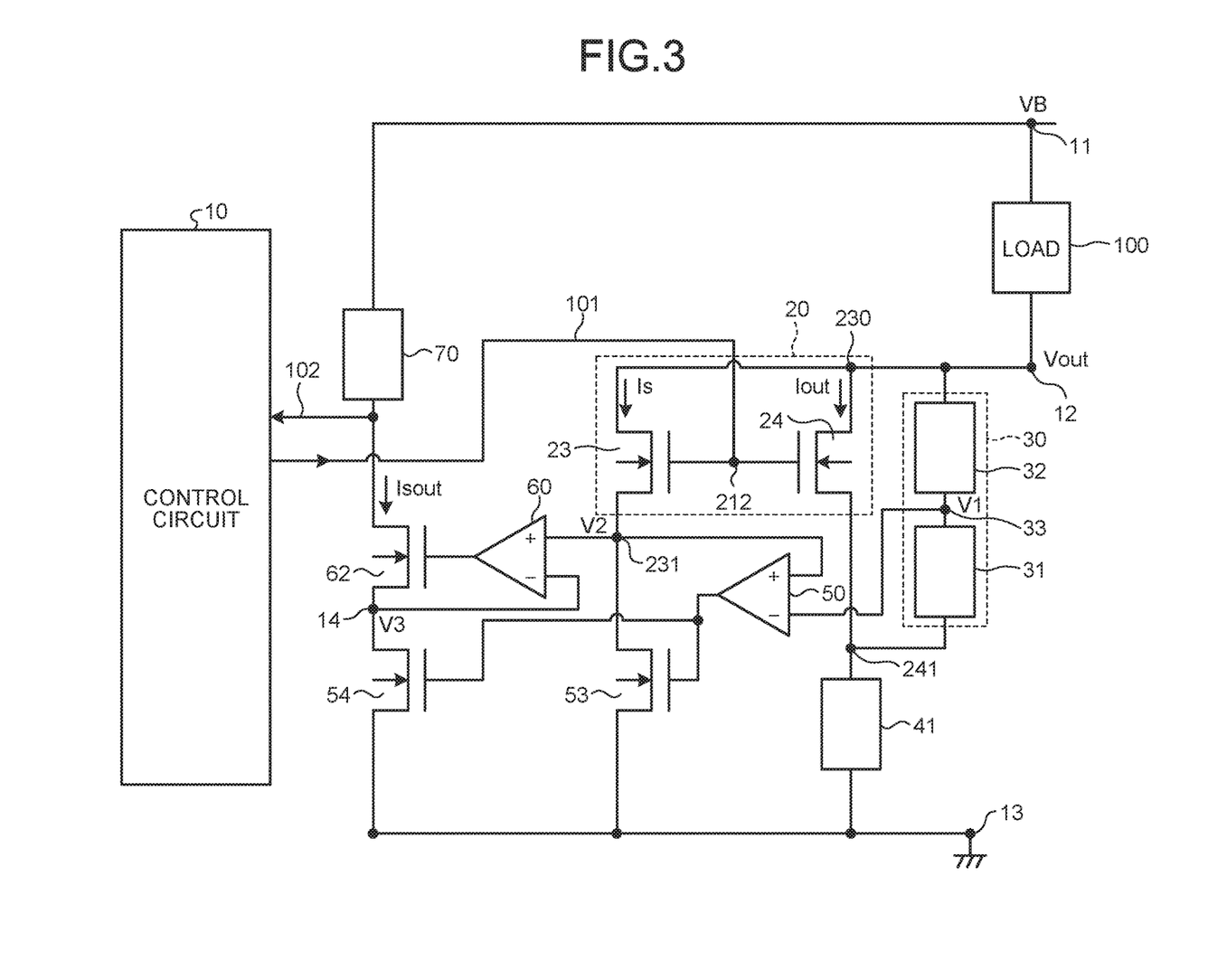
FIG. 3 is a diagram that illustrates a current detection circuit according to a second embodiment.

FIG. 3 is a diagram that illustrates a current detection circuit according to a second embodiment. A current detection circuit according to the present embodiment has an output transistor 24 between an output terminal 12 and a ground terminal 13. That is, it includes the output transistor 24 on a low side. It has a detection transistor 23 with a drain that is common to that of the output transistor 24. The output transistor 24 and the detection transistor 23 are composed of vertical structure N-channel-type MOS transistors. In a configuration example as illustrated in FIG. 2, conductivity types of a P-type region and an N-type region are reversed, so that it is possible to compose an N-channel-type MOS transistor.

It has a voltage-dividing circuit 30 that is connected to the output transistor 24 in parallel thereto. The voltage-dividing circuit 30 outputs from a connection point 33, and supplies to an inverting input terminal of an amplifier 50, a voltage V1 dependent on a voltage-dividing ratio D that is set by values of a resistor 31 and a resistor 32. A non-inverting input terminal of the amplifier 50 is connected to a source 231 of the detection transistor 23. A control circuit 10 supplies a driving signal that controls on/off to a gate 212 of the output transistor 24 and the detection transistor 23 via a signal line 101.

The amplifier 50 and an NMOS transistor 53 operate so as to cause a source voltage of the detection transistor 23 to be equal to a voltage V1. Therefore, it is possible to provide a configuration where a ratio of drain currents of the output transistor 24 and the detection transistor 23 is set by a ratio of on-resistances of the output transistor 24 and the detection transistor 23 and a ratio of respective source-drain voltages.

A voltage follower circuit that is composed of an amplifier 60 and an NMOS transistor 62 provides an imaginary short between input terminals of the amplifier 60, supplies a source voltage V2 of the detection transistor 23 to a connection point 14 of a drain of an NMOS transistor 54, and outputs a current that flows through the NMOS transistor 54. Other components and control are similar to those of FIG. 1, so that explanations thereof are omitted. Also in a configuration that includes the output transistor 24 on a low side, it is possible to improve accuracy of a current sense ratio. Furthermore, it is possible to readily adjust a current sense ratio by a voltage-dividing ratio D of the voltage-dividing circuit 30.

Third Embodiment

Figure 4:
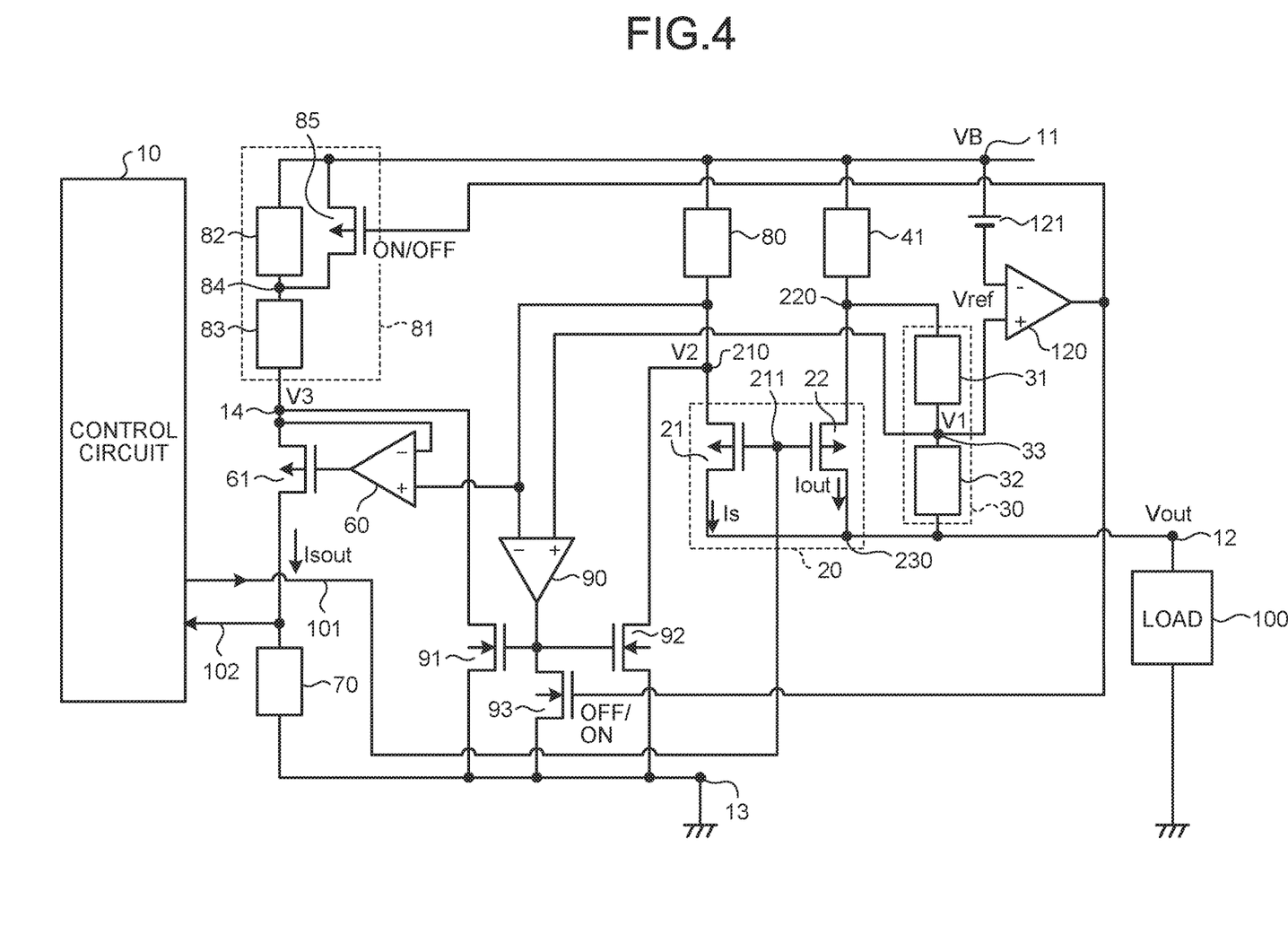
FIG. 4 is a diagram that illustrates a current detection circuit according to a third embodiment.

FIG. 4 is a diagram that illustrates a current detection circuit according to a third embodiment. A current detection circuit according to the present embodiment has a comparison circuit 120 that compares a voltage V1 with a reference voltage Vref that is set by a voltage source 121. A voltage V1 is a voltage provided by dividing a source-drain voltage of an output transistor 22. The comparison circuit 120 outputs an output signal at an H level as a voltage V1 is higher than a reference voltage Vref and outputs an output signal at an L level as the voltage V1 is lower than the reference voltage Vref.

A reference voltage Vref is set at a voltage at a boundary of operating regions that are a linear region and a saturation region of the output transistor 22. As a source-drain voltage VDS, a gate-source voltage VGS, and a threshold VTH of the output transistor 22 are provided, a relationship of VGS−VTH=VDS is provided. A voltage provided by dividing a voltage VDS at a time when the output transistor 22 is an on-state completely, at a voltage-dividing ratio D, is set as a reference voltage Vref.

A current detection circuit according to the present embodiment has an amplifier 90 with a non-inverting input terminal that is connected to a connection point 33 of a voltage-dividing circuit 30. An inverting input terminal of the amplifier 90 is connected to a source of a detection transistor 21.

An output of the amplifier 90 is connected to gates of NMOS transistors 91, 92. Sources of the transistors 91, 92 are connected to a ground terminal 13. A drain of the transistor 92 is connected to a source of the detection transistor 21. A configuration of a voltage follower that provides feedback of a drain of the transistor 92 to a source of the detection transistor 21 operates so as to cause a source voltage V2 to be equal to a voltage V1.

A drain of an NMOS transistor 93 is connected to gates of the transistors 91, 92. A source of the transistor 93 is connected to the ground terminal 13 and a gate thereof is supplied with an output of the comparison circuit 120. On/off of the transistor 93 are controlled by an output of the comparison circuit 120. That is, the transistor 93 is turned on at a time when an output at an H level is supplied from the comparison circuit 120, so that gates of the transistors 91, 92 are grounded.

As a gate of the transistor 92 is grounded, the transistor 92 is turned off, so that a voltage follower circuit that is provided by the amplifier 90 and the transistor 92 is turned off. That is, an operation to cause a voltage V2 to be equal to a voltage V1 is stopped. That is, in a case where a voltage V1 provided by dividing a source-drain voltage of the output transistor 22 is higher than a predetermined threshold voltage, an operation to cause a source voltage V2 of the detection transistor 21 to be equal to a voltage V1 is stopped.

A drain of the transistor 91 is connected to a connection point 14. A variable resistance circuit 81 is connected between the connection point 14 and a power source terminal 11. The variable resistance circuit 81 has resistors 82 and 83. A P-channel-type MOS transistor 85 is provided in such a manner that a drain is connected to a connection point 84 of the resistors 82 and 83 and a source is connected to the power source terminal 11.

An output of the comparison circuit 120 is supplied to a gate of the transistor 85. On/off of the transistor 85 are controlled by an output of the comparison circuit 120. That is, at a time when the comparison circuit 120 outputs a signal at an L level, the transistor 85 is turned on, so that the resistor 82 of the variable resistance circuit 81 is shorted. Therefore, a resistance value of the variable resistance circuit 81 is a value of the resistor 83.

The comparison circuit 120 outputs an output signal at an L level in a case where a voltage V1 is lower than a reference voltage Vref. Therefore, in a case where a voltage V1 is lower than a reference voltage Vref, a resistance value of the variable resistance circuit 81 is switched from values of the resistor 82 and the resistor 83 that are connected in series to a value of the resistor 83.

A source of the transistor 61 is connected to the connection point 14. An output of the amplifier 60 is supplied to a gate of the transistor 61. An inverting input terminal of the amplifier 60 is connected to the connection point 14 and a non-inverting input terminal thereof is connected to a source of the detection transistor 21. The amplifier 60 and the transistor 61 compose a voltage follower circuit and operate so as to cause a voltage V3 at the connection point 14 to be equal to a voltage V2. A voltage follower circuit that is composed of the amplifier 60 and the transistor 61 outputs a current that flows through the variable resistance circuit 81.

A drain of the transistor 61 is connected to one terminal of the detection resistor 70 and the other terminal of the detection resistor 70 is connected to the ground terminal 13. Information of a voltage drop that is caused at the detection resistor 70 is supplied to the control circuit 10 via a signal line 102.

(Operation at Time when Source-Drain Voltage of Output Transistor 22 is Low)

In a current detection circuit according to the present embodiment, an operation at a time when a source-drain voltage of an output transistor 22 is low is as follows. A time when a source-drain voltage of an output transistor 22 is low, as mentioned herein, is a case where a voltage V1 is lower than a reference voltage Vref. That is, it is a case where a voltage VSG at the output transistor 22 is high and the output transistor 22 operates in a linear region.

A voltage V1 is expressed by the following formula (13).

$$V1 = VB - (Rp \times Iout + Rm \times Iout/D \times (1-D)) \qquad (13)$$
$$= VB - (Rp + Rm/D \times (1-D)) \times Iout$$

A voltage V1 is lower than a reference voltage Vref, so that the comparison circuit 120 outputs a signal at an L level. Hence, a signal at an L level is supplied to a gate of a transistor 93, and due to an operation of a voltage follower circuit of an amplifier 90 and a transistor 92, a source voltage V2 of a detection transistor 21 is equal to a voltage V1.

A voltage VB at a power source terminal 11 is expressed by the following formula (14).

$$VB = Vout + Iout \times (Rp + Rm) \qquad (14)$$

A drain current Is of the detection transistor 21 is expressed by the following formula (15).

$$Is = (V2 - Vout)/Rs \qquad (15)$$

From a relationship of a voltage V1 being equal to a voltage V2, formula (13) and formula (14) are substituted into formula (15) to obtain the following formula (16).

$$Is = (V2 - Vout)/Rs \qquad (16)$$
$$= \{V1 - Vout\}/Rs$$
$$= \{VB - (Rp + Rm/D \times (1-D)) \times Iout - Vout\}/Rs$$
$$= \{Vout + Iout \times (Rp + Rm) - (Rp + Rm/D \times (D-1)) \times Iout - Vout\}/Rs$$
$$= (Rm/D \times Iout)/Rs$$
$$= Rm/Rs/D \times Iout$$

Due to an operation of a voltage follower circuit that is composed of an amplifier 60 and a transistor 61, a voltage V3 at a connection point 14 is equal to a source voltage V2 of the detection transistor 21. Therefore, a voltage that is applied between both terminals of a load resistance 80 and a voltage that is applied between both terminals of a variable resistance circuit 81 are equal.

A transistor 85 is turned on by a signal at a L level to be supplied. Thereby, if an on-resistance of the transistor 85 is ignored, a resistance value of the variable resistance circuit 81 is a value of a resistor 83.

If the load resistance 80 and the resistor 83 are of identical resistance values, a voltage that is applied between both terminals of the load resistance 80 is a voltage drop that is caused by a drain current Is, so that a detection output current Isout that flows through the resistor 83 is equal to the drain current Is.

Therefore, the following relational formula (17) is obtained from formula (16).

$$Isout = Rm/Rs/D \times Iout \qquad (17)$$
$$= RATIO \times Iout$$

That is, it is possible to obtain a detection output current Isout at a desired resistance ratio RATIO (=Rm/Rs/D).

(Operation at Time when Source-Drain Voltage VDS is High)

An operation at a time when a source-drain voltage VDS of an output transistor 22 is high is as follows. Additionally, a time when a source-drain voltage VDS of the output transistor 22 is high, as mentioned herein, is a case where a voltage V1 is higher than a reference voltage Vref. That is, it is an operating region where a gate-source voltage VGS of the output transistor 22 is low to be a value near a threshold Vth of the output transistor 22 and transfer from a saturation region to a linear region.

A voltage V1 is expressed by the following formula (18).

$$V1 = VB - (Rp \times Iout + Rm \times Iout/D \times (1-D)) \qquad (18)$$
$$= VB - (Rp + Rm/D \times (1-D)) \times Iout$$

A voltage V1 is higher than a reference voltage Vref, so that a comparison circuit 120 outputs a signal at an H level to turn on a transistor 93. Thereby, a gate of a transistor 92 is grounded, so that a voltage follower circuit that is composed of an amplifier 90 and the transistor 92 is turned off. Therefore, a source voltage V2 and a voltage VB are expressed by formula (19) and formula (20), respectively.

$$V2 = VB - R1 \times Is \qquad (19)$$
$$VB = V2 + R1 \times Is \qquad (20)$$
$$= Vout + Iout \times (Rp + Rm)$$

A drain current Is of a detection transistor 21 is expressed by the following formula (21).

$$Is = (VB - Vout)/(R1 + Rs) \qquad (21)$$
$$= \{Vout + Iout \times (Rp + Rm) - Vout\}/(R1 + Rs)$$
$$= (Rp + Rm)/(R1 + Rs) \times Iout$$

Due to an operation of a voltage follower circuit that is composed of an amplifier 60 and a transistor 61, a source voltage V2 and a voltage V3 are equal.

The comparison circuit 120 outputs a signal at an H level, so that a transistor 85 is turned off. Therefore, a resistance value of a variable resistance circuit 81 is a total of values of resistors 82 and 83. Therefore, a detection output current Isout that flows through the transistor 61 is expressed by the following formula (22).

$$Isout = (VB - V3)/(R2 + R3) \qquad (22)$$

Formula (19) and formula (20) are substituted into formula (22) to obtain the following formula (23).

$$Isout = \{V2 + R1 \times Is - V2\}/(R2 + R3) \quad (23)$$
$$= (R1 \times Is)/(R2 + R3)$$

R2 represents a resistance value of the resistor 82 and R3 represents a resistance value of the resistor 83.

If resistance values R1, R2, and R3 are equal, the following formula (24) is obtained from formula (22) and formula (23).

$$Isout = Is/2 \quad (24)$$
$$= (Rp + Rm)/(R1 + Rs) \times Iout/2$$

Furthermore, if Rp<<Rm and R1<<Rs are provided, the following formula (25) is obtained.

$$Isout \approx Rm/Rs \times Iout/2 \quad (25)$$

That is, it is possible to obtain a detection output current Isout dependent on a sense ratio that is set by a ratio of on-resistances of the output transistor 22 and the detection transistor 21. Therefore, in a case where Rm/Rs is 1/10000, it is possible to output a detection output current Isout at a desired sense ratio of 1/20000 for Iout.

If Rp=1 mΩ, Rm=1Ω, Rs=10 kΩ, R1=50Ω, Iout=1 A, and D=2 are provided, Is=0.0498 mA is provided. Therefore, a current sense ratio (Iout/Is) is 20079, so that it is possible to suppress an error to be 3.9% for a set current sense ratio of 20000. Therefore, even in a case where a source-drain voltage VDS of the output transistor 22 is high (a gate-source voltage VGS is near a threshold Vth) and it is impossible to supply a voltage V1 to a source of the detection transistor 21, it is possible to improve accuracy of a current sense ratio.

In a case where a voltage V1 is supplied to a source of the detection transistor 21 at a time when a source-drain voltage VDS of the output transistor 22 is high, a difference between source voltages of the output transistor 22 and the detection transistor 21 is increased. On the other hand, gates of the output transistor 22 and the detection transistor 21 are commonly connected, so that a state is provided where gate-source voltages of the output transistor 22 and the detection transistor 21 are greatly different. Therefore, on-resistances of the output transistor 22 and the detection transistor 21 vary greatly and a current sense ratio that is set by a ratio of on-resistances of the output transistor 22 and the detection transistor 21 varies greatly.

In the present embodiment, in a case where a source-drain voltage of the output transistor 22 is higher than a predetermined reference voltage Vref, an operation of a voltage follower circuit that is composed of the amplifier 90 and the transistor 92 that execute an operation to cause a source voltage V2 to be equal to a voltage V1 is stopped. Thereby, a variation in a ratio of on-resistances of the output transistor 22 and the detection transistor 21 is suppressed, so that it is possible to improve accuracy of a current sense ratio.

Fourth Embodiment

Figure 5:
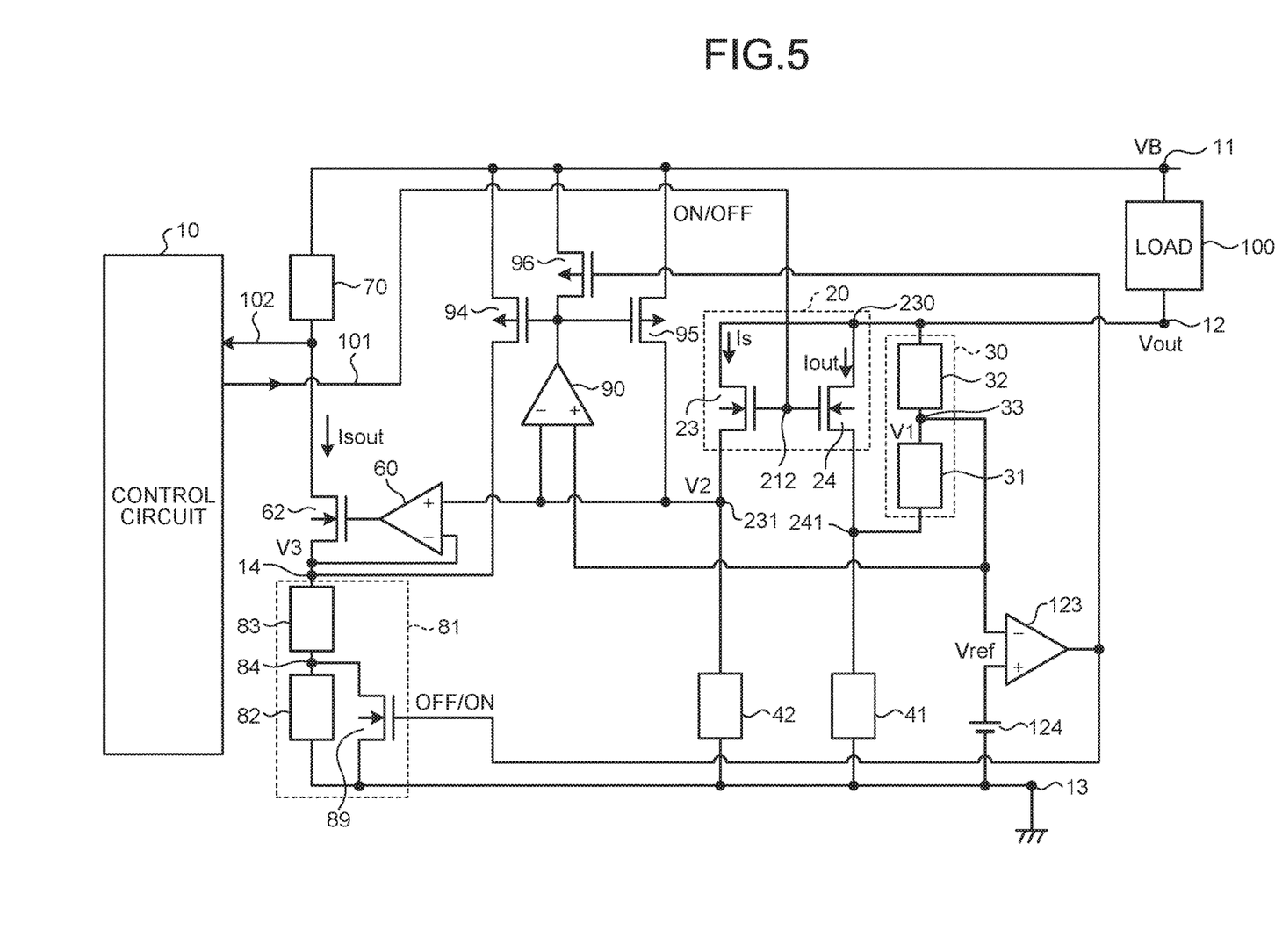
FIG. 5 is a diagram that illustrates a current detection circuit according to a fourth embodiment.

FIG. 5 is a diagram that illustrates a current detection circuit according to a fourth embodiment. A current detection circuit according to the present embodiment has an output transistor 24 between an output terminal 12 and a ground terminal 13. That is, it includes the output transistor 24 on a low side. Furthermore, it has a detection transistor 23 with a drain that is common to that of the output transistor 24. A load resistor 42 is connected to a source of the detection transistor 23. The output transistor 24 and the detection transistor 23 are composed of vertical structure N-channel-type MOS transistors. In a configuration example as illustrated in FIG. 2, a P-type region and an N-type region are reversed, so that it is possible to compose an NMOS transistor.

It has a voltage-dividing circuit 30 that is connected between a source—a drain of the output transistor 24. The voltage-dividing circuit 30 outputs, and supplies to a non-inverting input terminal of an amplifier 90, a voltage V1 dependent on a voltage-dividing ratio D that is set by setting of resistance values of a resistor 31 and a resistor 32.

The amplifier 90 and a transistor 95 operate so as to cause a source voltage V2 of the detection transistor 23 to be equal to a voltage V1. Therefore, a configuration is provided where a ratio of drain currents of the output transistor 24 and the detection transistor 23 is set by a ratio of on-resistances of the detection transistor 23 and the output transistor 24 and a ratio of source-drain voltages thereof.

It has a comparison circuit 123 that compares a voltage V1 with a reference voltage Vref that is set by a power source 124. As a voltage V1 is higher than a reference voltage Verf, the comparison circuit 123 outputs, and supplies to a gate of a transistor 96, a signal at an L level. Thereby, the transistor 96 is turned on, so that a voltage VB at a power source terminal 11 is applied to gates of transistors 94 and 95. Hence, the transistors 94, 95 are turned off, so that a voltage follower circuit that is composed of the amplifier 90 and the transistor 95 is turned off.

That is, in a case where a voltage V1 is higher than a reference voltage Verf, an operation to cause a source voltage V2 to be equal to a voltage V1 is stopped. Thereby, a situation where gate-source voltages of the output transistor 24 and the detection transistor 23 are greatly different is avoided, so that it is possible to improve accuracy of a current sense ratio (Iout/Isout).

On/off of an NMOS transistor 89 of a variable resistance circuit 81 is controlled by an output of the comparison circuit 123. That is, at a time when the comparison circuit 132 outputs a signal at an H level, the transistor 89 is turned on, so that a resistor 82 of the variable resistance circuit 81 is shorted. Herein, a resistance value of the variable resistance circuit 81 is a value of a resistor 83. A voltage follower circuit that is composed of an amplifier 60 and a transistor 62 outputs a current that flows through the variable resistance circuit 81.

Other components and control are similar to those of FIG. 4, so that explanations thereof are omitted. Also in a configuration that includes the output transistor 24 on a low side, it is possible to improve accuracy of a current sense ratio. Furthermore, it is possible to readily adjust a current sense ratio by a voltage-dividing ratio D of a voltage-dividing circuit 30.

Figure 6:
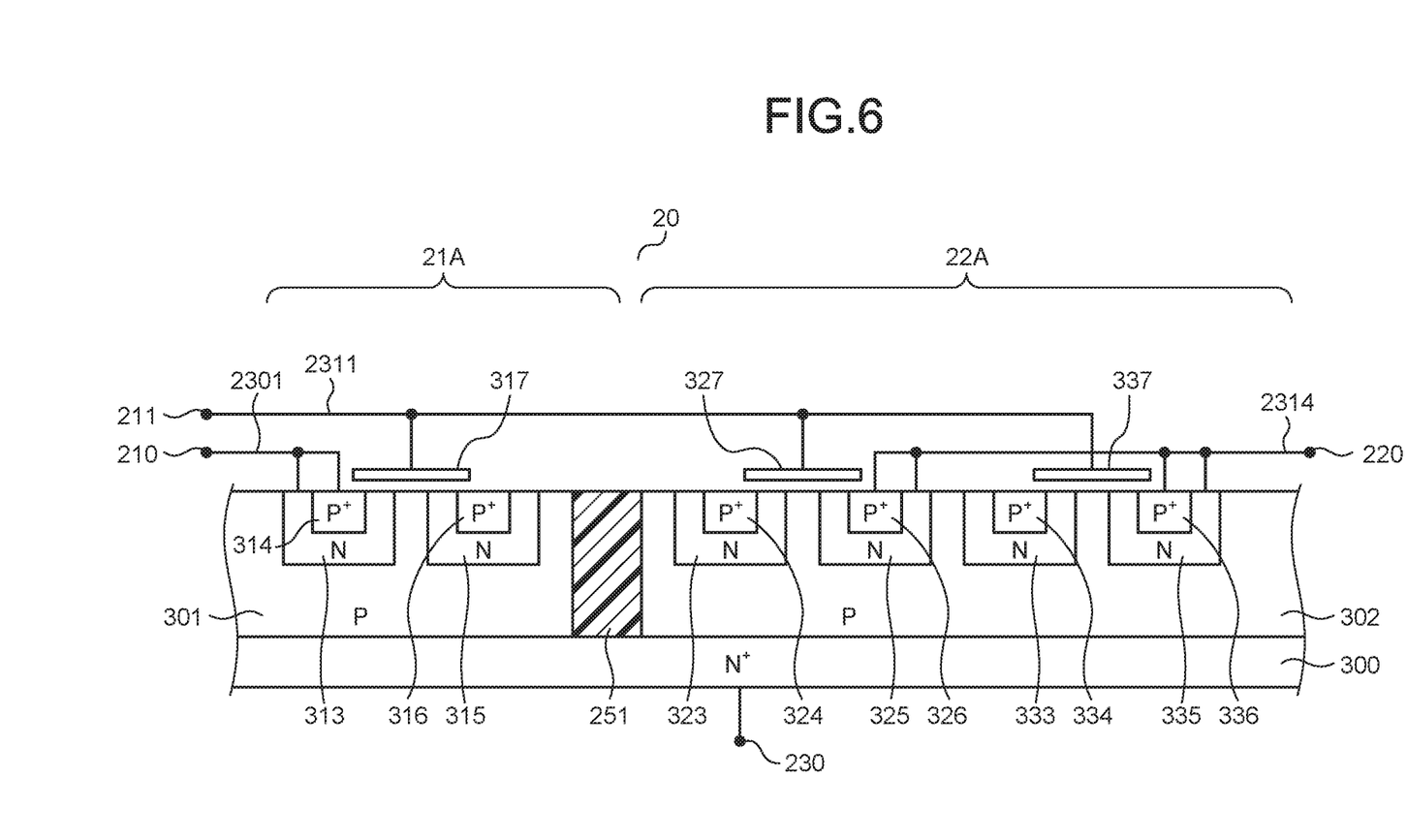
FIG. 6 is a diagram that illustrates an example of a vertical structure IGBT.

FIG. 6 schematically illustrates a cross-sectional structure of a vertical structure Insulated gate Bipolar Transistor (IGBT) that is capable of being used as a switching element 20 in an embodiment as already described. Additionally, an emitter, a gate, and a collector of an IGBT correspond to a source, a gate, and a drain of a MOS transistor, respectively, so that identical signs are used to cause sources 210, 220, a gate 211, and a drain 230 in an embodiment as already described to correspond to an emitter of an IGBT, a gate of the IGBT, and a collector of the IGBT. The switching element 20 that is composed of an IGBT has an N-type semiconductor substrate 300. The semiconductor substrate composes a collector region. A collector 230 that corresponds to a drain of a MOS transistor is formed on the semiconductor substrate 300.

It has P-type epitaxial layers 301, 302 on the semiconductor substrate 300. N-type diffusion regions 313, 315 are formed on the epitaxial layer 301. P-type diffusion regions 314, 316 are formed on the diffusion regions 313, 315. A gate 317 is provided on the diffusion regions 313, 315 via a (non-illustrated) insulation film. Additionally, the diffusion regions 313, 315 and the diffusion regions 314, 316 are formed as respective continuous integrated regions.

A detection transistor 21 is composed of a region 21A that has the diffusion regions 314, 316, the diffusion regions 313, 315, the epitaxial layer 301, and the semiconductor substrate 300. A P-channel-type IGBT is configured to have the diffusion regions 314, 316 as an emitter region, the semiconductor substrate 300 as a collector region, and the gate 317.

Each of the diffusion regions 313, 314 is connected to an emitter 210 via a wire 2301. The emitter 210 corresponds to a source of a MOS transistor, and hence, is conveniently represented by identical sign 210. The gate 317 is connected to the gate 211 via a wire 2311.

N-type diffusion regions 323, 325 are formed on the epitaxial layer 302 that is separated by a separation region 251. P-type diffusion regions 324, 326 are formed on the diffusion regions 323, 325. A gate 327 is provided on the diffusion regions 323, 325 via a (non-illustrated) insulation film. Additionally, the diffusion regions 323, 325 and the diffusion regions 324, 326 are formed as respective continuous integrated regions.

Moreover, N-type diffusion regions 333, 335 are formed on the epitaxial layer 302. P-type diffusion regions 334, 336 are formed on the diffusion regions 333, 335. A gate 337 is provided on the diffusion regions 333, 335 via a (non-illustrated) insulation film. Additionally, the diffusion regions 333, 335 and the diffusion regions 334, 336 are formed as respective continuous integrated regions.

An output transistor 22 is composed of a region 22A that has the P-type diffusion regions 324, 326, 334, 336, the N-type diffusion regions 323, 325, 333, 335, a P-type epitaxial layer 302, and an N-type semiconductor substrate 300. A P-channel-type IGBT is configured to have the diffusion regions 324, 326, 334, 336 as an emitter region, the semiconductor substrate 300 as a collector region, and the gates 327, 337.

Each of the diffusion regions 325, 326, 335, 336 is connected to an emitter 220 via a wire 2314. The gates 327, 337 are connected to the gate 211 via the wire 2311.

Conveniently, a configuration of one IGBT that is formed on the epitaxial layer 301 and two IGBTs that are connected in parallel on the epitaxial layer 302 is illustrated. The number of IGBTs that are connected in parallel is adjusted, so that it is possible to adjust a value of an on-resistance. That is, it is possible to adjust a current sense ratio.

In a configuration of IGBT in FIG. 6, in a case where a channel is each formed between a source and a drain by a voltage that is applied to the gate 211, a current in a vertical direction flows from a top surface side to a bottom side (a semiconductor substrate 300 side). Hence, a structure where the collector 230 is provided on a bottom side of the semiconductor substrate 300 and the emitter 210 is provided on a top surface side thereof composes a vertical structure switching element. A configuration that has a multi-emitter is provided so as to correspond to a multi-source MOS transistor in FIG. 2. A gate-emitter voltage of an IGBT corresponds to a gate-source voltage of a MOS transistor and an emitter-collector voltage corresponds to a source-drain voltage.

Additionally, it is possible to use a SiCMOS transistor with a material that is silicon carbide (SiC) instead of silicon, as a switching element. A SiCMOS transistor includes a feature with a small loss at a time of an operation and a high insulation breakdown voltage. Furthermore, a configuration may be provided by using a GaN MOS transistor that uses gallium nitride (GaN) as a semiconductor material.

Furthermore, a configuration may be provided in such a manner that the output transistors 22, 24 and the detection transistors 21, 23 are provided on both a high side and a low side and a detection output current Isout is detected by a configuration of an embodiment as already described. Drain currents Isout of the output transistor 22 on a high side and the output transistor 24 on a low side are detected, so that, for example, in a case where an overcurrent state is caused by a power supply fault that is a state where an output terminal 12 contacts a power source terminal 11 or a ground fault that is a state where the output terminal 12 is grounded, it is possible to stop supply of a switching signal from a control circuit 10 to the output transistors 22, 24 to avoid breaking of the output transistors 22, 24.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current detection circuit, comprising:
  a vertical structure output transistor that includes a first main electrode, a second main electrode, and a first control electrode where on/off thereof is controlled by a control signal that is applied to the first control electrode;
  a vertical structure detection transistor that has a third main electrode that is connected to the first main electrode, a second control electrode that is connected to the first control electrode, and a fourth main electrode;
  a voltage-dividing circuit that is connected between the first main electrode and the second main electrode and outputs a divided voltage provided by dividing a voltage between the first main electrode and the second main electrode at a predetermined ratio;
  a voltage supply circuit that supplies a voltage that is equal to an offset voltage combined with the divided voltage to the fourth main electrode; and
  a comparison circuit that turns on/off of an operation of the voltage supply circuit depending on a result of a comparison between the divided voltage and a predetermined reference voltage.

2. The current detection circuit according to claim 1, wherein the output transistor includes a P-channel-type vertical structure MOS transistor that has a drain electrode that is the first main electrode that is connected to a load, a source electrode that is the second main electrode that is connected to a power source terminal, and a gate electrode that is the first control electrode where the control signal is supplied thereto.

3. The current detection circuit according to claim 1, wherein the output transistor includes an N-channel-type vertical structure MOS transistor that has a source electrode that is the second main electrode that is connected to a ground terminal, a drain electrode that is the first main electrode that is connected to a load, and a gate electrode that is the first control electrode where the control signal is supplied thereto.

4. The current detection circuit according to claim 1, further comprising a variable resistance circuit where a voltage between both terminals of a load resistor that is connected to the fourth main electrode is applied between both terminals thereof and a resistance value thereof is switched in response to an output of the comparison circuit, and an output circuit that outputs a current that flows through the variable resistance circuit.

5. The current detection circuit according to claim 4, further comprising a control circuit that outputs the control signal depending on a current that is output by the output circuit.

6. The current detection circuit according to claim 1, wherein the voltage supply circuit has an amplification circuit that has an inverting input terminal and a non-inverting input terminal and the divided voltage and a voltage at the fourth main electrode are supplied to the inverting input terminal and the non-inverting input terminal of the amplification circuit, respectively.

7. The current detection circuit according to claim 1, wherein the output transistor includes a P-channel-type vertical structure IGBT that has a collector electrode that is the first main electrode that is connected to a load, an emitter electrode that is the second main electrode that is connected to a power source terminal, and a gate electrode that is the first control electrode where the control signal is supplied thereto.

8. The current detection circuit according to claim 1, wherein an on-resistance of the detection transistor is set at a high value relative to an on-resistance of the output transistor.

9. A current detection circuit, comprising:
a power source supply terminal;
an output terminal that is connected to a load;
a vertical structure output transistor that includes a first main electrode that is connected to the output terminal, a second main electrode that is connected to the power source supply terminal, and a first control electrode where on/off thereof is controlled by a control signal that is applied to the first control electrode;
a vertical structure detection transistor that has a third main electrode that is connected to the first main electrode, a second control electrode that is connected to the first control electrode, and a fourth main electrode;
a voltage-dividing circuit that is connected between the first main electrode and the second main electrode and outputs a divided voltage provided by dividing a voltage between the first main electrode and the second main electrode at a predetermined ratio;
a voltage supply circuit that supplies a voltage that is equal to an offset voltage combined with the divided voltage to the fourth main electrode; and
a comparison circuit that turns on/off of an operation of the voltage supply circuit depending on a result of a comparison between the divided voltage and a predetermined reference voltage.

10. The current detection circuit according to claim 9, wherein an on-resistance of the detection transistor is set at a high value relative to an on-resistance of the output transistor.

11. The current detection circuit according to claim 9, wherein the output transistor includes a P-channel-type vertical structure MOS transistor that has a drain electrode that is the first main electrode, a source electrode that is the second main electrode, and a gate electrode that is the first control electrode.

12. The current detection circuit according to claim 9, wherein the output transistor includes a P-channel-type vertical structure IGBT that has a collector electrode that is the first main electrode, an emitter electrode that is the second main electrode, and a gate electrode that is the first control electrode.

13. The current detection circuit according to claim 9, further comprising:
a resistance circuit where a voltage between both terminals of a load resistor that is connected to the fourth main electrode is applied between both terminals thereof;
an output circuit that outputs a current that flows through the resistance circuit; and
a control circuit that outputs the control signal depending on a current through the output circuit.

14. The current detection circuit according to claim 13, wherein the resistance circuit includes a variable resistance circuit where a resistance value thereof is switched in response to an output of the comparison circuit.

15. A current detection circuit, comprising:
a power source supply terminal;
a ground terminal;
an output terminal that is connected to a load;
a vertical structure output transistor that includes a first main electrode that is connected to the output terminal, a second main electrode that is connected to the ground terminal, and a first control electrode where on/off thereof is controlled by a control signal that is applied to the first control electrode;
a vertical structure detection transistor that has a third main electrode that is connected to the first main electrode, a second control electrode that is connected to the first control electrode, and a fourth main electrode;
a voltage-dividing circuit that is connected between the first main electrode and the second main electrode and outputs a divided voltage provided by dividing a voltage between the first main electrode and the second main electrode at a predetermined ratio;
a voltage supply circuit that supplies a voltage that is equal to an offset voltage combined with the divided voltage to the fourth main electrode; and
a comparison circuit that turns on/off of an operation of the voltage supply circuit depending on a result of a comparison between the divided voltage and a predetermined reference voltage.

16. The current detection circuit according to claim 15, wherein an on-resistance of the detection transistor is set at a high value relative to an on-resistance of the output transistor.

17. The current detection circuit according to claim 15, wherein the output transistor includes an N-channel-type vertical structure MOS transistor that has a source electrode that is the second main electrode, a drain electrode that is the first main electrode, and a gate electrode that is the first control electrode.

* * * * *